United States Patent
Matsushima et al.

(10) Patent No.: US 7,903,407 B2
(45) Date of Patent: Mar. 8, 2011

(54) COOLING SYSTEMS AND ELECTRONIC APPARATUS

(75) Inventors: Hitoshi Matsushima, Ryugasaki (JP);
Hiroshi Fukuda, Odawara (JP);
Tadakatsu Nakajima, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 73 days.

(21) Appl. No.: 12/370,651

(22) Filed: Feb. 13, 2009

(65) Prior Publication Data

US 2010/0027216 A1    Feb. 4, 2010

(30) Foreign Application Priority Data

Jul. 31, 2008 (JP) .................... 2008-197180

(51) Int. Cl.
*H05K 7/20* (2006.01)

(52) U.S. Cl. ......... 361/695; 361/690; 361/692; 361/701; 454/184; 62/259.2

(58) Field of Classification Search .................. None
See application file for complete search history.

(56) References Cited

U.S. PATENT DOCUMENTS

| | | | | |
|---|---|---|---|---|
| 5,321,581 A * | 6/1994 | Bartilson et al. | ............. | 361/695 |
| 5,718,628 A * | 2/1998 | Nakazato et al. | ............. | 454/184 |
| 6,557,357 B2 * | 5/2003 | Spinazzola et al. | ............. | 62/89 |
| 6,772,604 B2 * | 8/2004 | Bash et al. | ............. | 62/259.2 |
| 7,161,801 B2 * | 1/2007 | Chen et al. | ............. | 361/690 |
| 7,286,351 B2 * | 10/2007 | Campbell et al. | ............. | 361/696 |
| 7,295,444 B1 * | 11/2007 | Wang | ............. | 361/752 |
| 7,347,058 B2 * | 3/2008 | Malone et al. | ............. | 62/259.2 |
| 7,500,911 B2 * | 3/2009 | Johnson et al. | ............. | 454/184 |
| 7,534,167 B2 * | 5/2009 | Day | ............. | 454/187 |
| 7,542,287 B2 * | 6/2009 | Lewis et al. | ............. | 361/695 |
| 7,643,291 B2 * | 1/2010 | Mallia et al. | ............. | 361/695 |
| 2009/0168345 A1 * | 7/2009 | Martini | ............. | 361/691 |

FOREIGN PATENT DOCUMENTS

| | | |
|---|---|---|
| JP | 58-16638 | 4/1983 |
| JP | 63-93702 | 6/1988 |
| JP | 2001-156478 | 6/2001 |
| JP | 2001-272091 | 10/2001 |
| JP | 2004-55883 | 2/2004 |
| JP | 2004-508526 | 3/2004 |
| JP | 2006-208000 | 8/2006 |
| JP | 2007-505285 | 3/2007 |
| WO | WO 02/16854 | 2/2002 |

* cited by examiner

*Primary Examiner* — Boris L Chervinsky
(74) *Attorney, Agent, or Firm* — Antonelli, Terry, Stout & Kraus, LLP.

(57) ABSTRACT

Temperature variation among electronic apparatuses installed in the data center is reduced, enhancement in reliability of the electronic apparatuses, and increase in service life are achieved, and efficient cooling of an electronic apparatus group is realized. Further, an electronic apparatus with low noise is provided. A front cover is provided on a front surface of an electronic apparatus, and a back cover is provided on a rear surface of it. A supplied air opening is formed at a lower side of the front cover, and an exhaust air opening is formed at an upper side of the back cover. The supplied air opening is connected to a blowing in opening from below the floor level, and the exhaust air opening is connected to a ceiling air duct. The ceiling air duct is provided with a heat exchanger, and indirect heat exchange is performed with external air.

6 Claims, 10 Drawing Sheets

COOLING SYSTEMS AND ELECTRONIC APPARATUS

BACKGROUND OF THE INVENTION

The present invention relates to a cooling system and electronic apparatus in which ambient temperature of a data center containing therein the electronic apparatus is adjusted.

An electronic apparatus such as a disk array apparatus is configured by being loaded with a number of magnetic or optical disk drives inside a casing to enhance reliability of data storage. These disk array apparatuses are operated by management software by being connected with a high-speed special network line such as an optical line, and used as a SAN (Storage Area Network), NAS (Network Attached Storage), or a single RAID (Redundant Array of Inexpensive Disks) disk apparatus.

The main heat generation sources of the disk drives loaded on these disk array apparatuses are control electronic components such as a drive motor, an actuator, and an LSI. Heat of them is cooled by cooling air which is supplied by the cooling fan installed in the disk array casing. When the cooling ability is low, the temperature of the disk drives rises, which results in an error operation and degradation of long-term reliability. Further, heat generation of the controller which controls exchange of data between an external controller and disk drives is likely to be large.

When cooling ability is insufficient, the temperature of these controllers rises, and as a result, an error operation and occurrence of element breakdown are feared. Further, reduction in noise which occurs from the fan for driving the air flow in the disk array apparatus is an important problem, and the air flow quantity required for cooling sometimes cannot be sufficiently secured due to noise.

Thus, the disk array apparatus has the problem of favorable cooling of each of the heat generating members and reduction in noise of the apparatus. This similarly applies to the other electronic apparatuses having heat generating elements such as CPUs.

Due to increase in the scales of storages following proliferation of blade servers and rapid increase in data volume, rapid increase in power consumption becomes a critical requirement for operation of data centers.

A data center is a generic name of the facility which keeps the servers of customers, and provides connection line to the Internet, maintenance and operation service and the like. In the data center, a number of severs and storages are installed in rows, and air conditioning equipment which cools them, an uninterruptible power supply prepared for power failure, a private power generator and the like are included.

The heat generation amount of a server increases at an annual rate of 20 to 25%, and it is estimated to be about 20 kW per one casing several years later. Therefore, the ratio of the server power consumption and the power consumption required for cooling it is considered to be 1:1.5 to 2.0 from 1:1 of the present state, and the power required for cooling become a bottle neck.

In the conventional data center and the like, a number of disk array apparatuses and electronic apparatuses are installed in the same space, and as the configuration of the air conditioner, there is generally adopted such a configuration as cold air is supplied from the undersurface side of the floor, and heat is exhausted from the ceiling portion. Further, many of the disk array apparatuses and electronic apparatuses installed in the data centers are mounted in a 19-inch standard rack (the horizontal interval of the screws of the apparatus mounting support post is set as 19 inches, and the apparatus with a width of about 483 mm can be mounted) which is specified by Electronic Industry Association of the U.S.A (EIA) and Japanese Industrial Standard (JIS). In this case, the air for cooling is taken in from the front side of the rack, and exhausted from the rear side.

In the configuration of such an air conditioner, when the disk array apparatuses and electronic apparatuses are mounted with high density, there arises the problem of easily taking in the warmed air in the vicinity of the ceiling again. This is because when circulation of the air inside the chamber is insufficient, the flow easily occurs, in which the warm air rising to the area in the vicinity of the ceiling goes to the front side of the apparatuses in each of the rows of the columns of the apparatus racks. Alternatively, this is because when there are a plurality of rows for the racks, exhaust air of the lower stage of the front side is easily taken into the upper stage of the rear row. This becomes the cause of increase in air conditioning cost and limitation of the number of apparatuses which are mounted.

As the conventional art concerning the data center, the system which monitors the air flow to make cooling efficient, and controls cooling in the data center in accordance with the detected air flow is open to the public (see JP-A-2006-208000). Further, there is provided the system for determining the recirculation index value of air flow (see JP-A-2007-505285).

As the prior art relating to the conventional electronic apparatus, there is the one that supplies cold air from below the floor level of a rack to cooling the apparatuses in the rack favorably, and exhausts warm air from a side of a ceiling (see JP-A-2004-55883). Further, there is the one that identifies a high heat generation apparatus part in the rack, and supplies cold air to it (see JP-A-2001-272091). Alternatively, there is the one that performs heat exchange of the inside of an electronic component storing box by using external air (see JP-A-2001-156478). Further, there is the one that takes in mixture air with external air (see JP-B2-58-16638).

BRIEF SUMMARY OF THE INVENTION

In each of the prior arts according to JP-A-2006-208000 and JP-A-2007-505285, a sensor is required to be installed in each place in a data center and a controller for determining a situation is required to be separately provided, which complicates the apparatus configuration.

In each of the prior arts according to JP-A-2004-55883 and JP-A-2001-272091, the structure of performing heat exchange between warm air and external air is not adopted.

In each of the prior arts according to JP-A-2001-156478 and JP-B2-58-16638, the structure of providing the heat exchanger using external air and the internal air conditioner in combination is not adopted. Concerning the electronic apparatus in the data center, the control reference of temperature/humidity is strictly set. Thus, if the humidity is not in the proper range even when the external air temperature is sufficiently low, external air cannot be introduced. If external air can be introduced, humidity control is needed, and thus, energy for humidification and dehumidification following this generates.

Further, in each of the prior arts according to JP-A-2006-208000, JP-A-2007-505285, JP-A-2004-55883, JP-A-2001-272091, JP-A-2001-156478 and JP-B2-58-16638, the configuration of reducing the noise of the electronic apparatuses is not disclosed.

An object of the present invention is to provide efficient cooling for an electronic apparatus group, which reduces temperature variation among electronic apparatuses installed in a data center, and an electronic apparatus with low noise.

The above described object is achieved by, in a cooling system configured by an inside room in which an electronic apparatus is installed, an air conditioning area at below a floor level, an air conditioner, a ceiling air duct and the like, including a front cover provided on a front surface of the electronic apparatus, a back cover provided on a rear surface, supplied air openings provided in a lower side of the front cover, exhaust air openings provided in an upper side of the back cover, blowing in openings of the air conditioning area at below the floor level to which the supplied air openings are connected, and intake openings of the ceiling air duct to which the exhaust air openings are connected.

Further, the above described object is achieved by that the ceiling air duct is divided into a system in which exhaust air from the electronic apparatus flows, and a system in which external air flows, a heat exchanger is provided between the two systems, and indirect heat exchange is performed between exhaust air and external air.

Further, the above described object is achieved by providing a silencer in the vicinity of a blowing out opening of the ceiling air duct located in the inside room.

Further, the above described object is achieved by introducing external air into the ceiling air duct, and performing heat exchange between exhaust air of the electronic apparatus and the external air by the heat exchanger provided in the duct.

Further, the above described object is achieved by providing the front cover provided on the front surface of the electronic apparatus, the back cover provided on the rear surface, the supplied air openings provided in the lower side of the front cover, and the exhaust air openings provided in the upper side of the rear cover.

Further, the above described object is achieved by that the exhaust air openings include jet flow generating means which exhausts air upward.

Further, the above described object is achieved by that the jet flow generating means is in a nozzle shape.

Further, the above described object is achieved by that the jet flow generating means is an exhaust fan.

Further, the above described object is achieved by that a duct is provided at an upper side of the jet flow generating means, and the duct is provided with an opening at a place corresponding to a position of the jet flow generating means provided at each of the electronic apparatuses.

According to the present invention, temperature variation among the electronic apparatuses installed in the data center is reduced, efficient cooling of an electronic apparatus group and the electronic apparatus with low noise can be provided.

Other objects, features and advantages of the invention will become apparent from the following description of the embodiments of the invention taken in conjunction with the accompanying drawings.

DETAILED DESCRIPTION OF THE INVENTION

Hereinafter, one embodiment of the present invention will be described with reference to the drawings.

Embodiment 1

Figure 1:
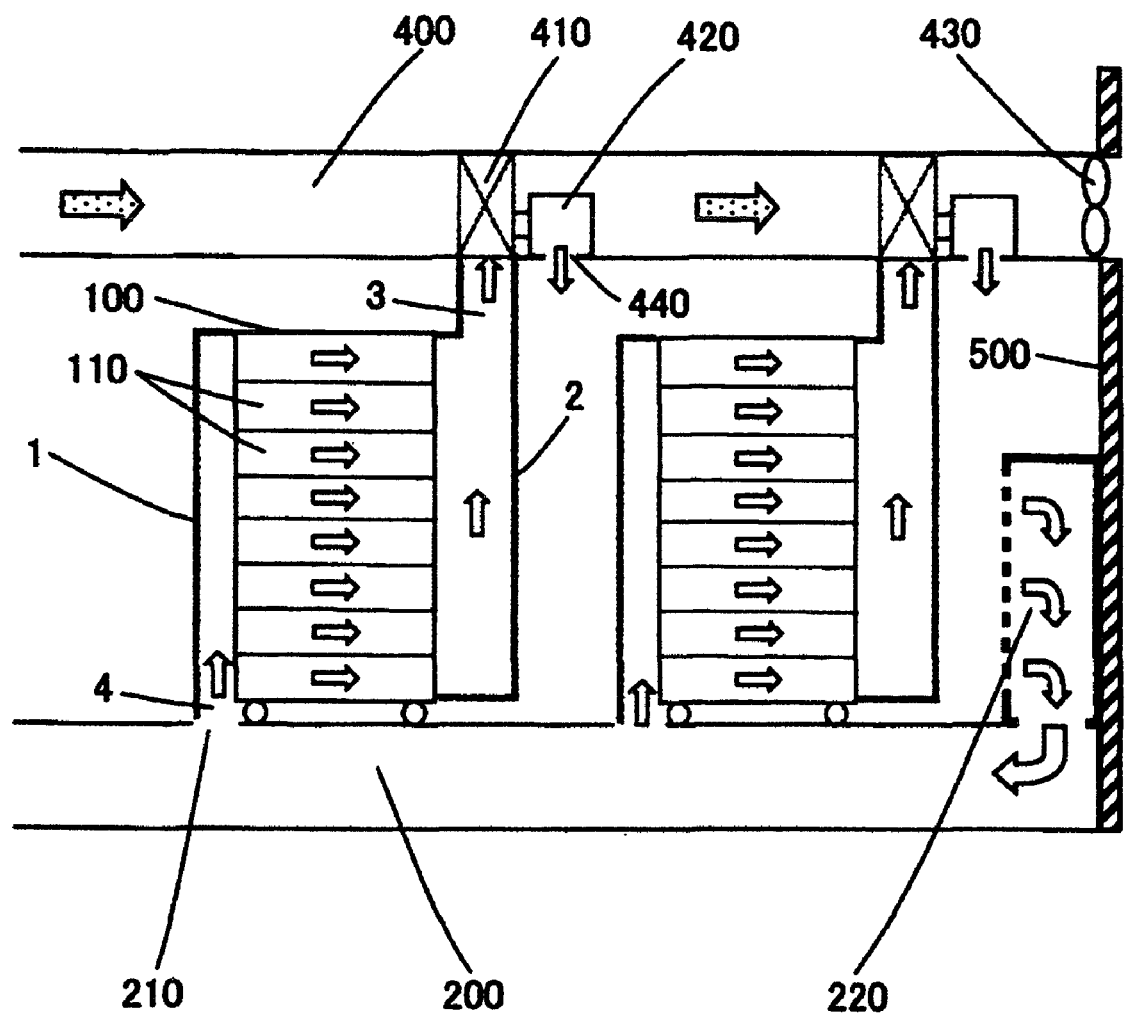
FIG. 1 is a schematic general view of a cooling system which is a first embodiment of the present invention.
Figure 2:
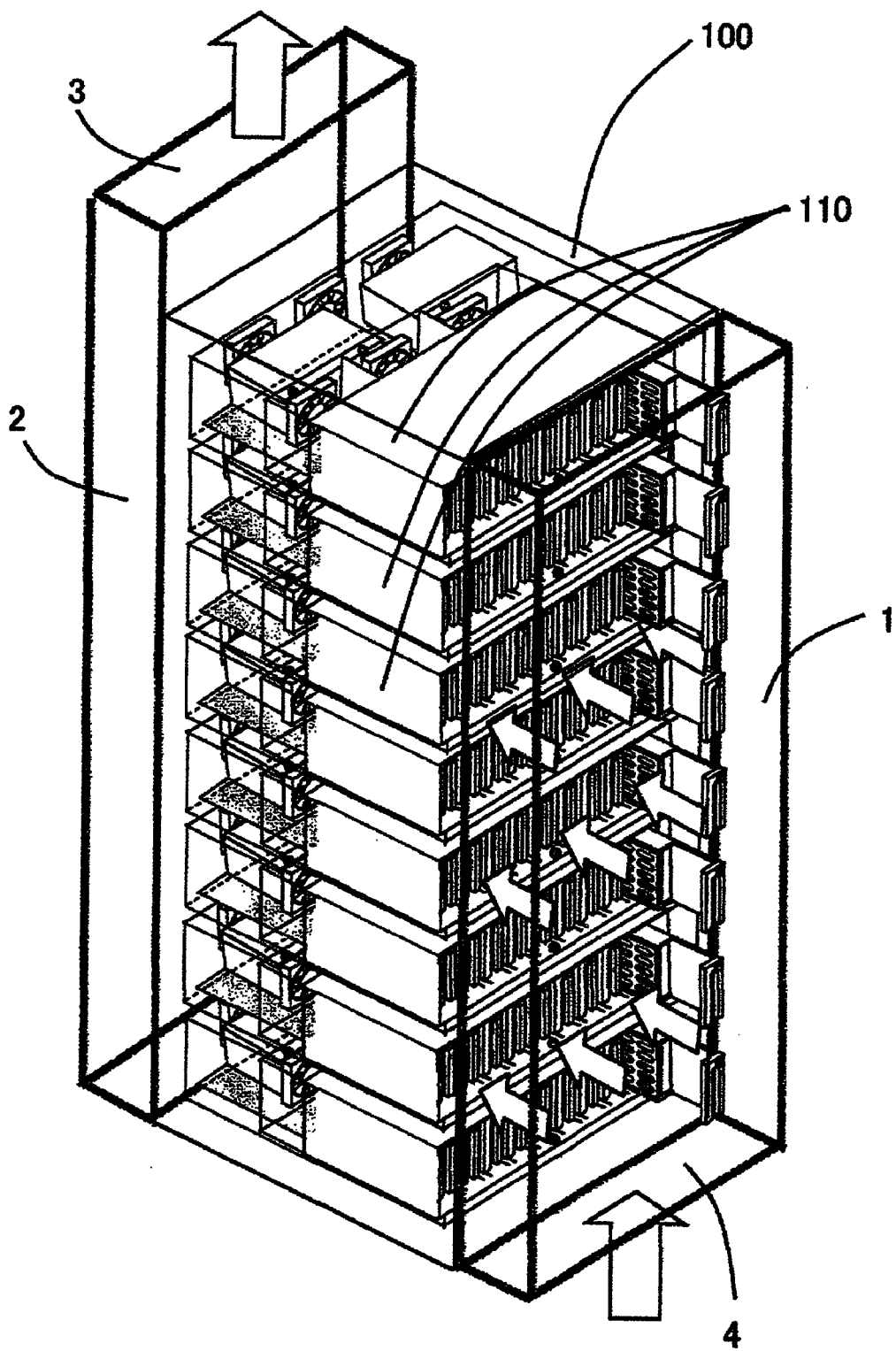
FIG. 2 is a bird's-eye view of an electronic apparatus in the first embodiment.

FIG. 1 is a schematic configuration view of a cooling system including one embodiment of the present invention. FIG. 2 is a perspective view of an electronic apparatus including the present embodiment.

In FIGS. 1 and 2, a cooling system of the present embodiment is configured by an electronics rack 100, an air conditioning area at below the floor level 200, an air conditioner 220, a ceiling air duct 400 and the like. The electronics rack 100 is configured by electronic equipment 110 in multiple layers installed in the rack. In the present embodiment, a 19-inch standard rack is adopted, and a plurality of fans not illustrated are provided in the electronic equipment 110 in the multiple layers installed in the rack. By the fans, cooling air is taken in from the front side of the rack and is exhausted from the rear side. Further, in the present embodiment, a front cover 1 is provided at the front surface of the electronics rack 100, and a back cover 2 is provided at the rear surface. A supplied air opening 4 is provided at a lower side of the front cover 1 of the front surface, and an exhaust air opening 3 is provided at an upper side of the back cover 2 at the rear surface. In the present embodiment, the supplied air opening 4 is connected to a blowing in opening from below the floor level 210, and the exhaust air opening 3 is connected to a ceiling air duct 400.

The air conditioning area at below the floor level 200 has a double floor structure, and a plurality of blowing in openings from below the floor level 210 are provided in the upper floor surface. In the present embodiment, the location of the blowing in opening from below the floor level 210 corresponds to the location of each of the electronics racks 100. The blowing out openings of the air conditioner 220 are connected to the end surface of the air conditioning area at below the floor level 200 at a wall 500 side, and cold air for cooling each of the electronics racks 100 is discharged into the air conditioning area at below the floor level 200 from the blowing out opening. The air conditioner 220 at the intake side takes in warmed air of the indoor space where the group of the electronics racks 100 is installed.

The ceiling air duct 400 is provided with a heat exchanger 410, a silencer 420, a duct fan 430, and a ceiling blowing out opening 440. By the operation of the duct fan 430, external air flows inside the ceiling air duct 400. In the case of FIG. 1, external air flows in from the wall 500 (not illustrated) at the left side, and is exhausted from the wall 500 at the right side where the duct fan 430 is placed. The heat exchanger 410 is for gas/gas, with one flow path being connected to the external air flowing in the ceiling air duct 400, and the other flow path being connected to the exhaust air opening 3 and the silencer 420. A sound absorbing material is laid on the inner wall of the silencer 420.

In such a configuration, the indoor air which is warmed to about 50 to 60° C. by cooling the electronics rack 100 exchanges heat with external air at about 0 to 30° C. by passing through the heat exchanger 410 from the exhaust air opening 3 to be cooled to about 40° C., and thereafter, is returned into the chamber from the ceiling blowing out opening in the silencer 420. Finally, the air is cooled to about 15 to 20° C. at which no condensation forms in the air conditioner 220. Thereafter, the air passes through the blowing in opening from below the floor level 210 from the air conditioning area at below the floor level 200, and flows into the electronics rack 100 again from the supplied air opening 4 in the front cover 1.

In this case, the external air and the indoor air are completely separated. Therefore, new humidity control as in ordinary use of external air is not required, and energy needed for humidification and de-humidification is not required, whereby energy is saved. Further, by heat exchange with external air, the temperature of air entering the air conditioner 220 lowers, and therefore, cooling load in the air conditioner 220 reduces, whereby energy is saved.

Incidentally, the main noise source when a number of electronics racks 100 are arranged is the sound from the fans inside the electronics racks 100, but by the front cover 1 and the back cover 2, sound can be prevented from directly escaping outside the electronics rack 100. Further, the noise which occurs in the electronics rack 100 is reduced in the silencer 420, and therefore, silencing of the inside of the chamber can be realized.

When a number of disk array apparatuses and electronic apparatuses are installed in the same space in the conventional data center or the like, if the apparatuses are mounted with high density, there arises the problem of easily taking in the warmed air in the vicinity of the ceiling again. When the warmed air is taken in again, increase in air conditioning cost and limitation of the number of apparatuses which are mounted are caused.

In the present embodiment, the orientation of the supplied air opening 4 of the front cover 1 is configured to be downward, and therefore, as the supplied air to the electronics rack 100, cold air under the floor level is easily taken in. Further, exhaust air flows smoothly to the ceiling side through the exhaust air opening 3. Therefore, the possibility of the electronics rack 100 taking in the warmed air in the vicinity of the ceiling again can be significantly decreased.

According to the present embodiment, the sound from the fans which is the main noise source of the electronics rack 100 can be efficiently prevented from escaping outside the rack, and silencing of the rack can be achieved. Further, the possibility of the electronics rack 100 taking in the warmed air in the vicinity of the ceiling again can be significantly decreased, and cooling efficiency can be enhanced.

Embodiment 2

Figure 3:
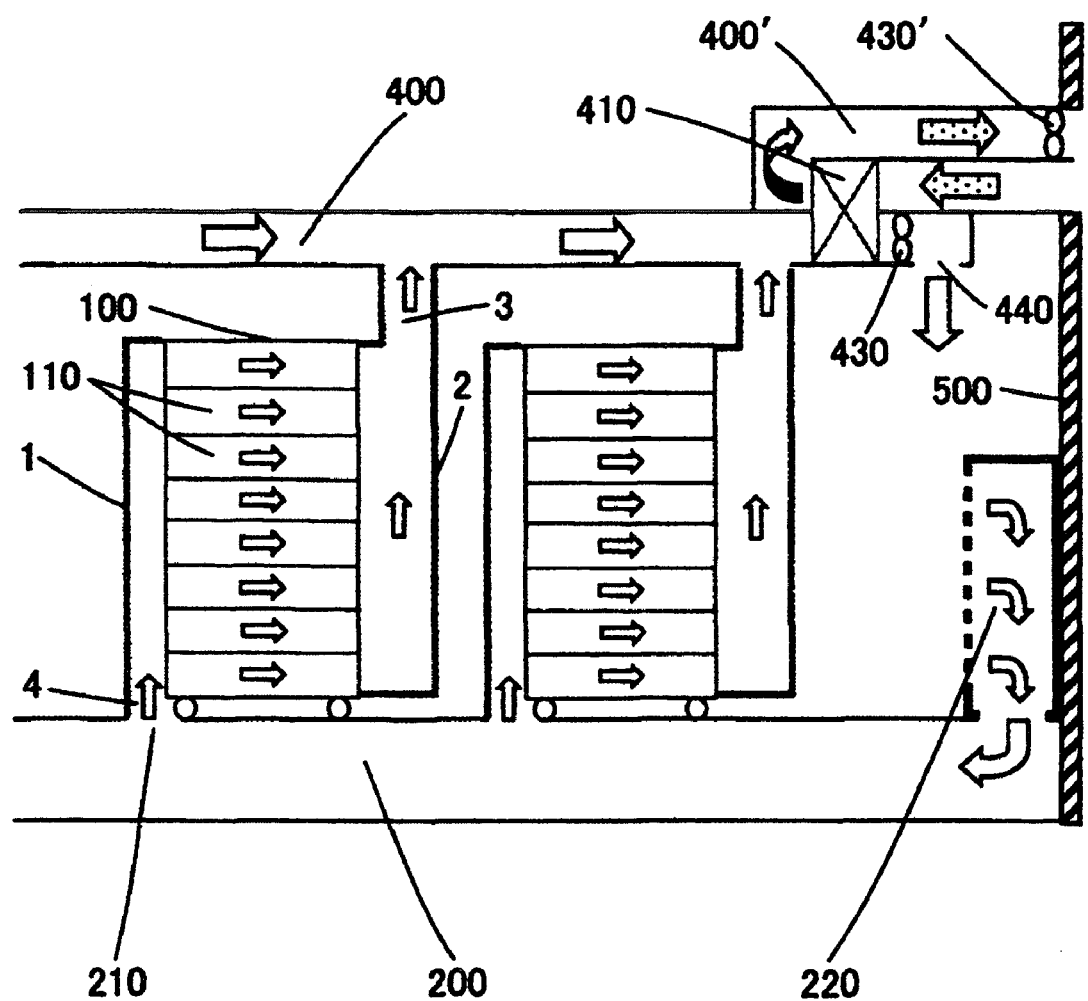
FIG. 3 is a schematic general view of a cooling system which is a second embodiment of the present invention.

FIG. 3 is a schematic configuration view of a cooling system including a second embodiment of the present invention.

In FIG. 3, the cooling system is also configured by the electronics rack 100, the air conditioning area at below the floor level 200, the air conditioner 220, the ceiling air duct 400 and the like in the present embodiment. In the present embodiment, the flow path is divided into two flow paths that are the ceiling air duct 400 in which the indoor side air flows, and a ceiling air duct 400' in which external air flows, and the heat exchanger 410 is provided between the two flow paths. In the case of FIG. 3, external air flows in from the lower right side of the wall 500, and is exhausted from the upper right side of the wall 500. The heat exchanger 410 is for gas, with one flow path being connected to the external air flowing inside the ceiling air duct 400', and with the other flow path being connected to the indoor air flowing in the ceiling air duct 400.

The ceiling air duct 400' at the external air side is provided with a duct fan 430', and by the operation of the duct fan 430', external air flows inside the ceiling air duct 400' at the external air side. The ceiling air duct 400 at the indoor air side is provided with the duct fan 430 and the ceiling blowing out opening 440. The air which is warmed by cooling each of the electronics racks 100 is collected in the ceiling air duct 400 connected to each of the exhaust air openings 3, flows inside the ceiling air duct 400 by the help of the duct fan 430, and cooled in the heat exchanger 410 and thereafter, returns into the chamber from the ceiling blowing out opening 440.

In such a configuration, the indoor air which is warmed to about 50 to 60° C. by cooling the electronics rack 100 goes to the heat exchanger 410 from the exhaust air opening 3, where the air exchanges heat with external air at about 0° C. to 30° C. to be cooled to about 40° C., and thereafter, the air is returned into the chamber from the ceiling blowing out opening 440. The air is finally cooled to about 15 to 20° C. at which no condensation forms in the air conditioner 220. Thereafter, the air passes through the blowing in opening from below the floor level 210 from the air conditioning area at below the floor level 200, and flows into the electronics rack 100 again from the supplied air opening 4 in the front cover 1.

In this case, the external air and the indoor air are completely separated. Therefore, new humidity control as in ordinary use of external air is not required, and thus, energy required for humidification and de-humidification is not required, whereby energy is saved. Further, by heat exchange with external air, the temperature of the air entering the air conditioner 220 lowers, and therefore, cooling load in the air conditioner 220 reduces, whereby energy is saved.

The main noise source when a number of electronics racks 100 are arranged is the sound from the fans inside the electronics racks 100, but by the front cover 1 and the back cover 2, sound can be prevented from directly escaping outside the electronics racks 100, and silencing of the inside of the chamber can be realized.

When a number of disk array apparatuses and electronic apparatuses are installed in the same space in the conventional data center or the like, if the apparatuses are mounted with high density, there arises the problem that the warmed air in the vicinity of the ceiling is easily taken in again. This causes increase in air conditioning cost and limitation of the number of apparatuses which are mounted.

However, in the present embodiment, the orientation of the supplied air opening 4 of the front cover 1 is configured to be downward, and therefore, as the supplied air to the electronics rack 100, cold air under the floor level is easily taken in. Further, exhaust air flows smoothly to the ceiling side through the exhaust air opening 3, and returns to the indoor side just before the air conditioner 220. Therefore, the possibility of the electronics rack 100 taking in the warmed air in the vicinity of the ceiling again can be significantly decreased.

According to the present embodiment, the possibility of the electronics rack 100 taking in the warmed air in the vicinity of the ceiling again can be significantly decreased, and efficiency of cooling can be enhanced. Further, in the present embodiment, ducts of two systems are required, but since the heat exchanger 410 is concentrated in one place, there is provided the advantage in the aspect of the entire facility cost and the efficiency of heat exchange with external air.

Embodiment 3

Figure 4:
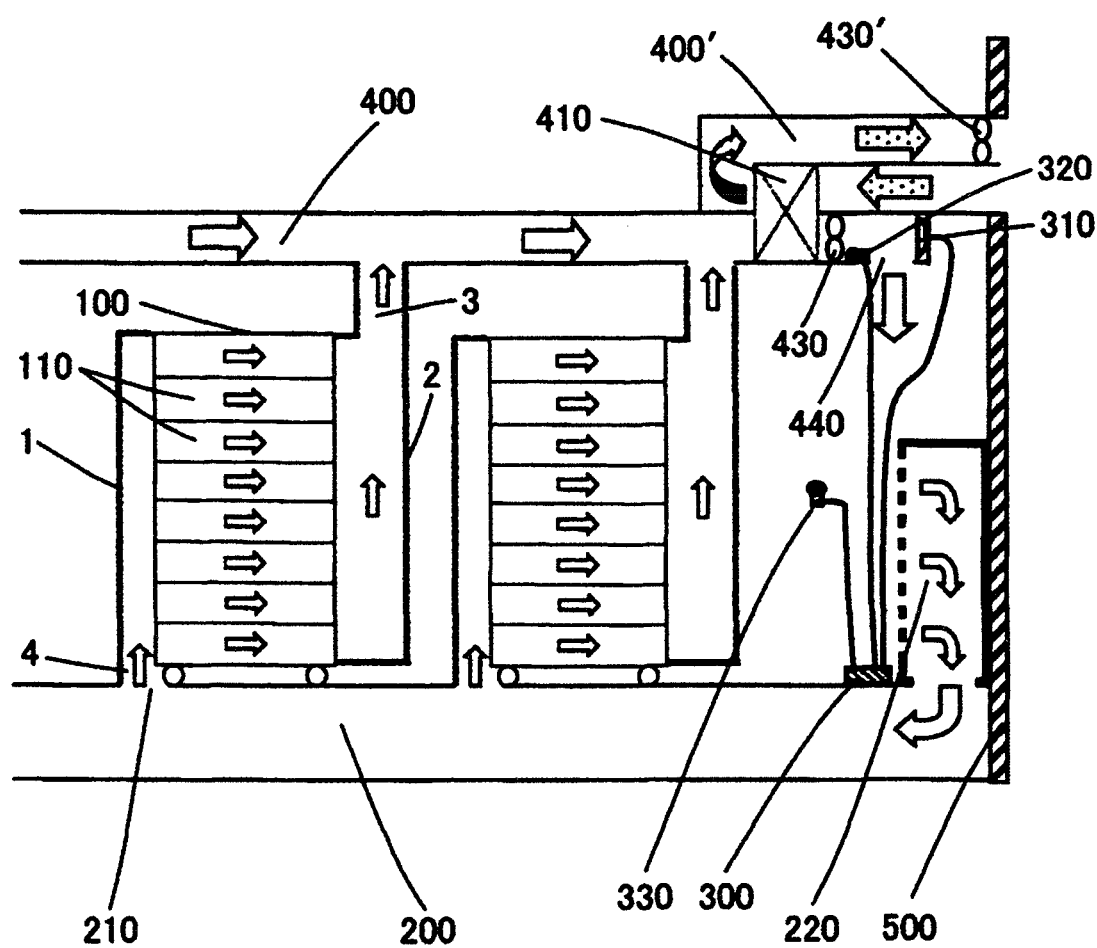
FIG. 4 is a schematic general view of a cooling system which is a third embodiment of the present invention.

A third embodiment of the present invention is shown in FIG. 4.

FIG. 4 is a schematic general view of a cooling system in the present embodiment.

In FIG. 4, the cooling system is also configured by the electronics rack 100, the air conditioning area at below the floor level 200, the air conditioner 220, the ceiling air duct 400 and the like in the present embodiment. Further, the ceiling air duct 400 is divided into two flow paths that are an indoor side air flow 400a, and an external air flow 400a', and the heat exchanger 410 is provided between the two flow paths.

In the present embodiment, a set of an ANC (Active Noise Control) device is incorporated in the vicinity of the ceiling blowing out opening 440 of the ceiling air duct 400 at the indoor air side. The ANC device of the present embodiment is configured by an error sensor 330, a noise sensor 320, a speaker 310, and an active noise controller 300. The ANC device calculates a signal in an opposite phase for each frequency component from the sound of the noise source which is picked up by the error sensor 330 in the active noise controller 300, and generates this from the speaker 310 as the correction sound in the opposite phase from that of the noise source, and thereby silencing is achieved. At this time, the active noise controller 300 incessantly repeats the calculation so that the noise value in the error sensor 330 becomes the minimum.

The main noise source when a number of electronics racks 100 are arranged is the sound from the fans inside the electronics racks 100, but by the front cover 1 and the back cover 2, sound can be prevented from directly escaping outside the electronics rack 100.

The noise which occurs in the electronics rack 100 is transmitted through the ceiling air duct 400 at the indoor air side, and finally comes into the chamber from the ceiling blowing out opening 440, but the waves become uniform while the sound is transmitted through the long ceiling air duct 400 to be a substantially one-dimensional sound wave. Therefore, silencing by the ANC can be performed extremely favorably. Therefore, favorable silencing in the chamber can be achieved.

As above, according to the present embodiment, the sound from the fans and disk drives which are the main noise source of the electronics racks 100 can be effectively prevented from escaping outside the racks, and effective silencing of the electronics racks 100 can be achieved. Further, the possibility of the electronics rack 100 taking in the warmed air in the vicinity of the ceiling again can be significantly decreased, and cooling efficiency can be enhanced.

In the present embodiment, as compared with the case of the embodiment 2 without the ANC, significant silencing of the data center indoor space can be achieved by the operation of the ANC. However, the rack configuration becomes complicated and cost increases, since the sensors 320 and 330 and the active noise controller 300 are required.

Embodiment 4

Figure 5:
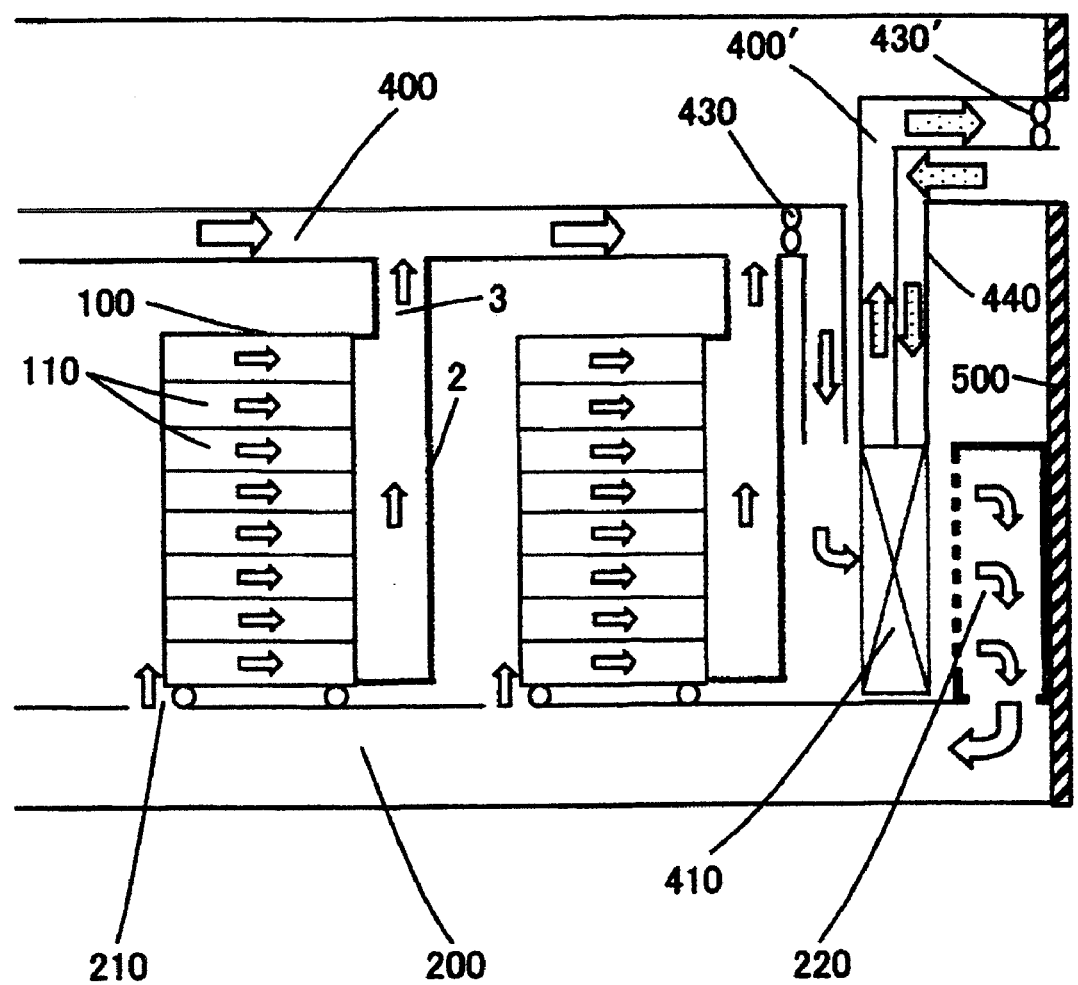
FIG. 5 is a schematic general view of a cooling system which is a fourth embodiment of the present invention.

A fourth embodiment of the present invention is shown in FIG. 5.

FIG. 5 is a schematic general view of a cooling system in the present embodiment.

In FIG. 5, the cooling system is also configured by the electronics rack 100, the air conditioning area at below the floor level 200, the air conditioner 220, the ceiling air duct 400 and the like in the present embodiment. In the present embodiment, the front cover 1 is omitted unlike the embodiments described so far.

In the present embodiment, the ceiling air duct is divided into two systems that are an indoor side air flow 400a, and an external air flow 400a', and the heat exchanger 410 is provided in the flow path of a ceiling air duct 400' at the external air side. The heat exchanger 410 is for gas, with one flow path being connected to the external air flowing inside the ceiling air duct 400' at the external air side, and with the other flow path being connected to the indoor air. The ceiling air duct 400' at the external air side is provided with the duct fan 430', and by the operation of the duct fan 430', external air flows inside the ceiling air duct 400' at the external air side. The ceiling air duct 400 at the indoor air side is provided with the duct fan 430 and the ceiling blowing out opening 440. The air warmed by cooling each of the electronics racks 100 is collected in the ceiling air duct 400 connected to each of the exhaust air openings 3, flows inside the ceiling air duct 400 by the help of the duct fan 430, and is released into the chamber from the ceiling blowing out opening 440 in the immediate vicinity of the heat exchanger 410.

In such a configuration, the indoor air which is warmed to about 50 to 60° C. by cooling the electronics rack 100 returns into the chamber from the ceiling blowing out opening 440, then the air exchanges heat with external air at about 0° C. to 30° C. to be cooled to about 40° C. in the heat exchanger 410, and thereafter, enters the air conditioner 220. The air is cooled to about 15 to 20° C. at which no condensation forms by the air conditioner 220. Thereafter, the air passes through the blowing in opening from below the floor level 210 from the air conditioning area at below the floor level 200, and flows into the electronics rack 100 again.

In this case, the external air and the indoor air are completely separated. Therefore, new humidity control as in ordinary use of external air is not required, and energy required for humidification and de-humidification is not required, whereby energy is saved. Further, by heat exchange with external air, the temperature of air entering the air conditioner 220 lowers, and therefore, cooling load in the air conditioner 220 reduces, whereby energy is saved.

When a number of disk array apparatuses and electronic apparatuses are installed in the same space in the conventional data center or the like, if the apparatuses are mounted with high density, there arises the problem of easily taking in the warmed air in the vicinity of the ceiling again. This problem causes increase in air conditioning cost and limitation of the number of apparatuses which are mounted.

In the present embodiment, exhaust air flows smoothly to the ceiling side through the exhaust air opening 3, and returns to the indoor side just before the air conditioner 220. Therefore, the possibility of the electronics rack 100 taking in the warmed air in the vicinity of the ceiling again can be significantly decreased.

According to the present embodiment, the possibility of the electronics rack 100 taking in the warmed air in the vicinity of the ceiling again can be significantly decreased, and cooling efficiency can be enhanced.

In the present embodiment, the heat exchanger 410 is installed just before the air conditioner 220. By this, the air which is cooled to about 40° C. in the heat exchanger 410 flows into the air conditioner 220 without mixing with the air in the chamber. Therefore, cooling efficiency in the air conditioner 220 is enhanced, and the effect of reducing the air conditioning load is provided.

Embodiment 5

Figure 6:
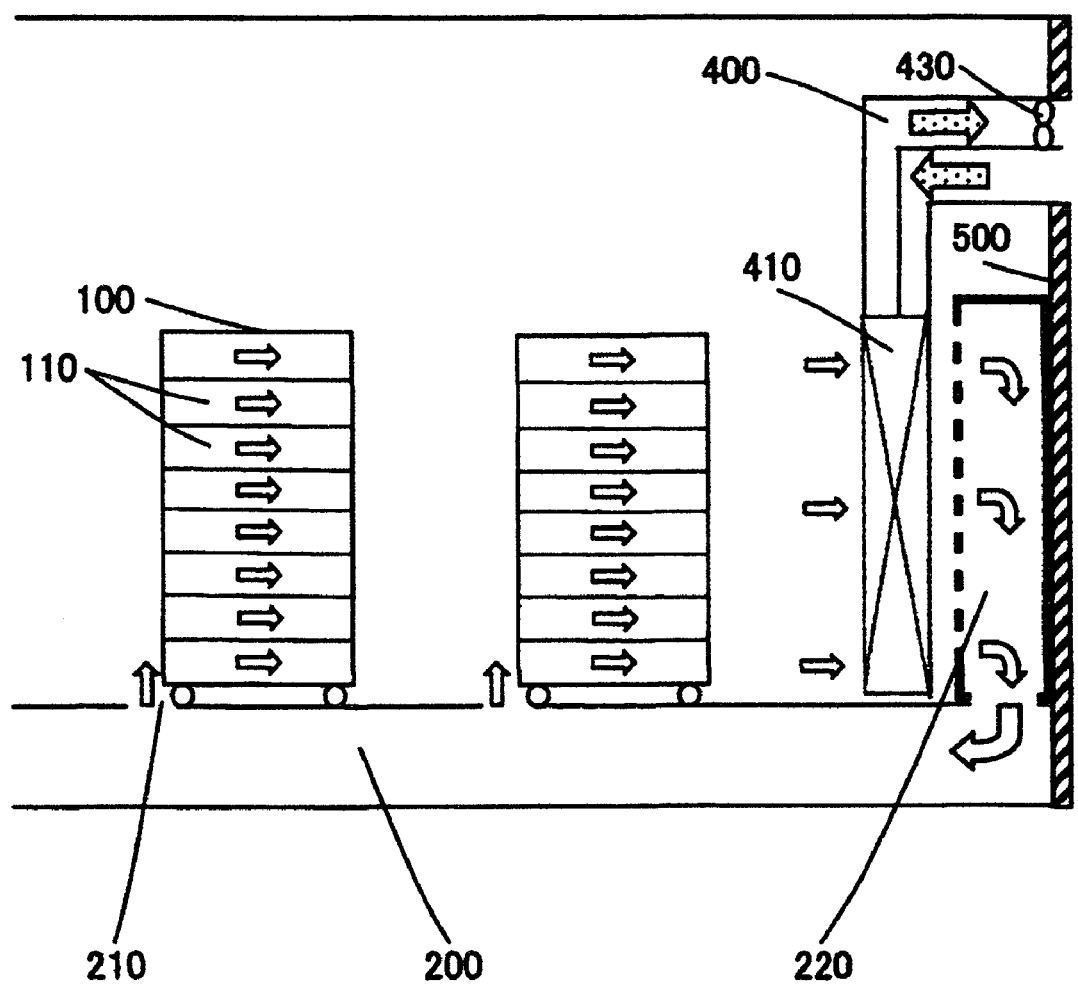
FIG. 6 is a schematic general view of a cooling system which is a fifth embodiment of the present invention.

FIG. 6 shows a fifth embodiment of the present invention.

FIG. 6 is a schematic general view of a cooling system in the present embodiment.

In FIG. 6, a cooling system is also configured by the electronics rack 100, the air conditioning area at below the floor level 200, the air conditioner 220, the ceiling air duct 400 and the like in the present embodiment. In the present embodiment, the front cover 1 and the back cover 2 are omitted unlike the embodiments described so far.

In the present embodiment, the ceiling air duct 400 is constituted of one system in which external air flows, and the heat exchanger 410 is provided in the flow path. The heat exchanger 410 is for gas, with one flow path being connected to the external air flowing inside the ceiling air duct 400, and with the other flow path being connected to the indoor air. The ceiling air duct 400 at the external air side is provided with the duct fan 430, and by the operation of the duct fan 430, external air flows inside the ceiling air duct 400. The air warmed by cooling each of the electronics racks 100 is released into the chamber from each of the exhaust sides.

In such a configuration, the indoor air which is warmed by cooling the electronics rack 100 is released into the chamber, thereafter, the air exchanges heat with external air in the heat exchanger 410, and thereafter, enters the air conditioner 220. The air is cooled to such a degree as not to form condensation in the air conditioner 220. Thereafter, the air passes through the blowing in opening from below the floor level 210 from the air conditioning area at below the floor level 200, and flows into the electronics rack 100 again.

In this case, the external air and the indoor air are completely separated. Therefore, new humidity control as in the ordinary use of external air is not required, and energy required for humidification and de-humidification is not required, whereby energy is saved. Further, by heat exchange with external air, the temperature of air entering the air conditioner 220 lowers, and therefore, cooling load in the air conditioner 220 reduces, whereby energy is saved.

According to the present embodiment, cooling efficiency of the electronics rack 100 can be enhanced even with the relatively simple configuration.

In the present embodiment, the effect of being capable of simplifying the entire system configuration is provided. However, in the electronics racks 100 in the second rows and thereafter, there arises the possibility of taking in the exhaust air coming out of the electronics racks 100 in the previous rows.

Embodiment 6

Figure 7:
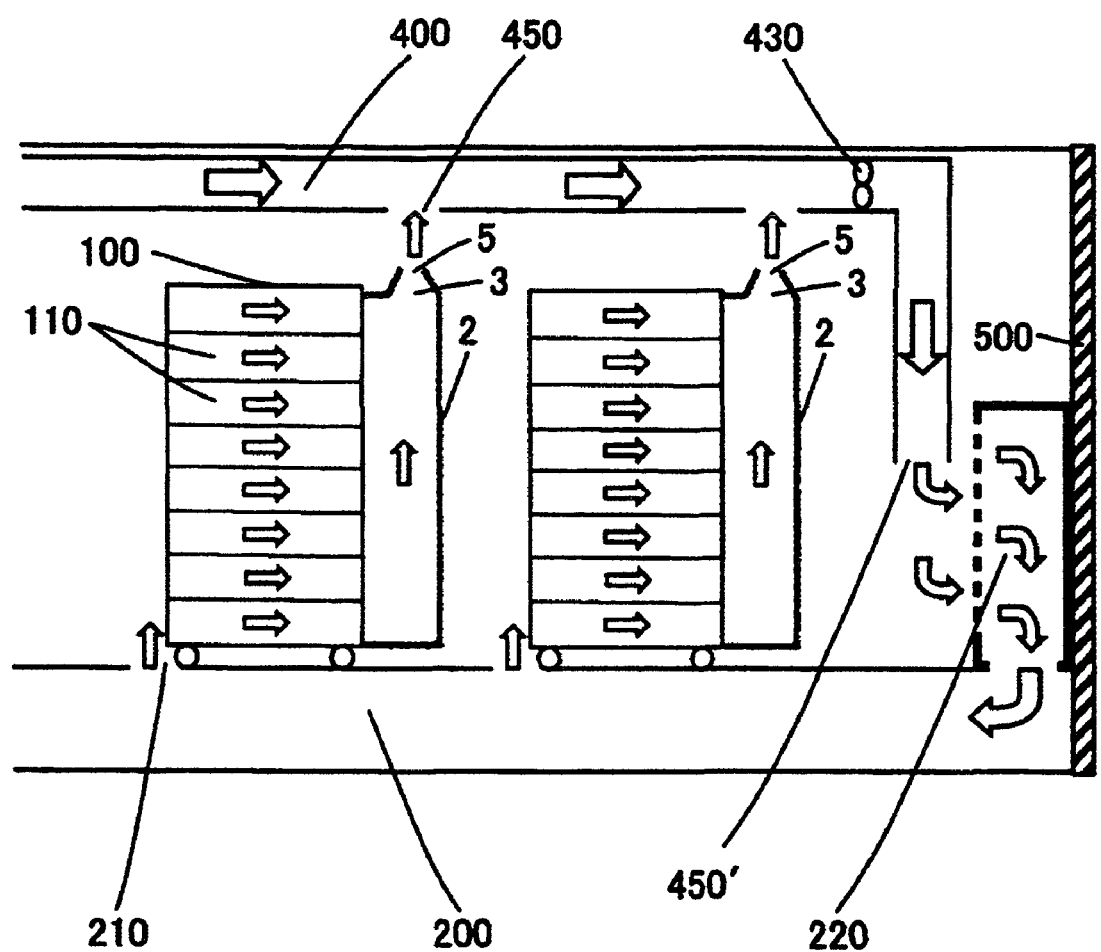
FIG. 7 is a schematic general view of a cooling system which is a sixth embodiment of the present invention.
Figure 8:
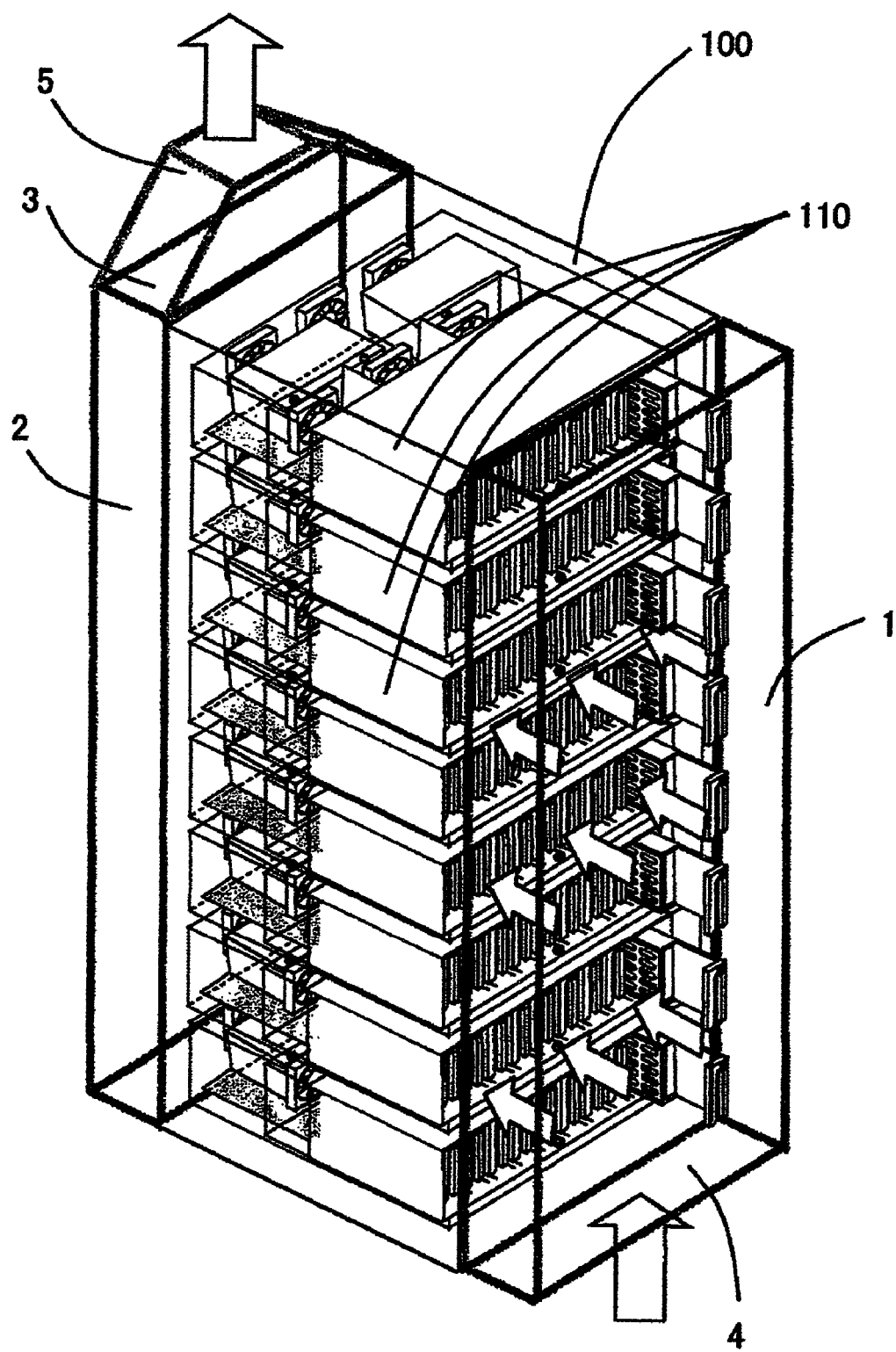
FIG. 8 is a bird's-eye view of an electronic apparatus in the sixth embodiment of the present invention.

A sixth embodiment of the present invention is shown in FIGS. 7 and 8.

FIG. 7 is a schematic general view of a cooling system in the present embodiment.

FIG. 8 is a bird's-eye view of an electronics rack in the present embodiment.

In FIGS. 7 and 8, the cooling system is also configured by the electronics rack 100, the air conditioning area at below the floor level 200, the air conditioner 220, the ceiling air duct 400 and the like in the present embodiment. In the present embodiment, the front cover 1 is also omitted.

In the present embodiment, a nozzle 5 is provided at an upper end portion of the exhaust air opening 3. Further, in the present embodiment, a duct opening 450 is provided at the position corresponding to the nozzle 5 in the ceiling air duct 400. The ceiling air duct 400 is provided with the duct fan 430, which causes indoor side air to flow. In the present embodiment, the heat exchanger 410 is omitted. Further, a duct opening 450' at the exhaust air side of the ceiling air duct 400 is provided just before the air conditioner 220.

The air warmed by cooling each of the electronics racks 100 is released from the nozzle 5 provided at the upper end portion of each of the exhaust air openings 3 in the jet flow state toward the duct opening 450 of the ceiling air duct 400. Thereafter, the air is collected in the ceiling air duct 400 by the operation of the duct fan 430 in the ceiling air duct 400, and thereafter, flows in the ceiling air duct 400 to be released into the chamber from the duct opening 450 in the immediate vicinity of the air conditioner 220.

In such a configuration, the indoor air which is warmed to about 50 to 60° C. by cooling the electronics rack 100 returns into the chamber from the duct opening 450', and thereafter, the air enters the air conditioner 220 without being mixed with the indoor air. Subsequently, the air is cooled to about 15 to 20° C. at which no condensation forms in the air conditioner 220. Thereafter, the air passes through the blowing in opening from below the floor level 210 from the air conditioning area at below the floor level 200, and flows into the electronics rack 100 again.

When a number of disk array apparatuses and electronic apparatuses are installed in the same space in the conventional data center or the like, if the apparatuses are mounted with high density, there arises the problem that the warmed air in the vicinity of the ceiling is easily taken in again. This causes increase in air conditioning cost and limitation of the number of apparatuses which are mounted. In the present embodiment, exhaust air flows smoothly to the ceiling side through the exhaust air opening 3, and returns to the indoor side just before the air conditioner 220. Therefore, the possibility of the electronics rack 100 taking in the warmed air in the vicinity of the ceiling again is significantly decreased.

According to the present embodiment, the possibility of the electronics rack 100 taking in the warmed air in the vicinity of the ceiling again can be significantly decreased, and cooling efficiency can be enhanced. Further, in the present embodiment, the exhaust air opening 3 does not need to be connected to the ceiling air duct 400, and therefore, the electronics rack 100 is easily installed.

In the present embodiment, the duct opening 450' at the exhaust air side of the ceiling air duct 400 is provided just before the air conditioner 220. By this, the warm air from each of the electronics racks 100 which is collected in the ceiling air duct 400 flows into the air conditioner 220 without mixing with the air in the chamber. Therefore, cooling efficiency in the air conditioner 220 is enhanced, and the effect of reducing the air conditioning load is provided.

Embodiment 7

Figure 9:
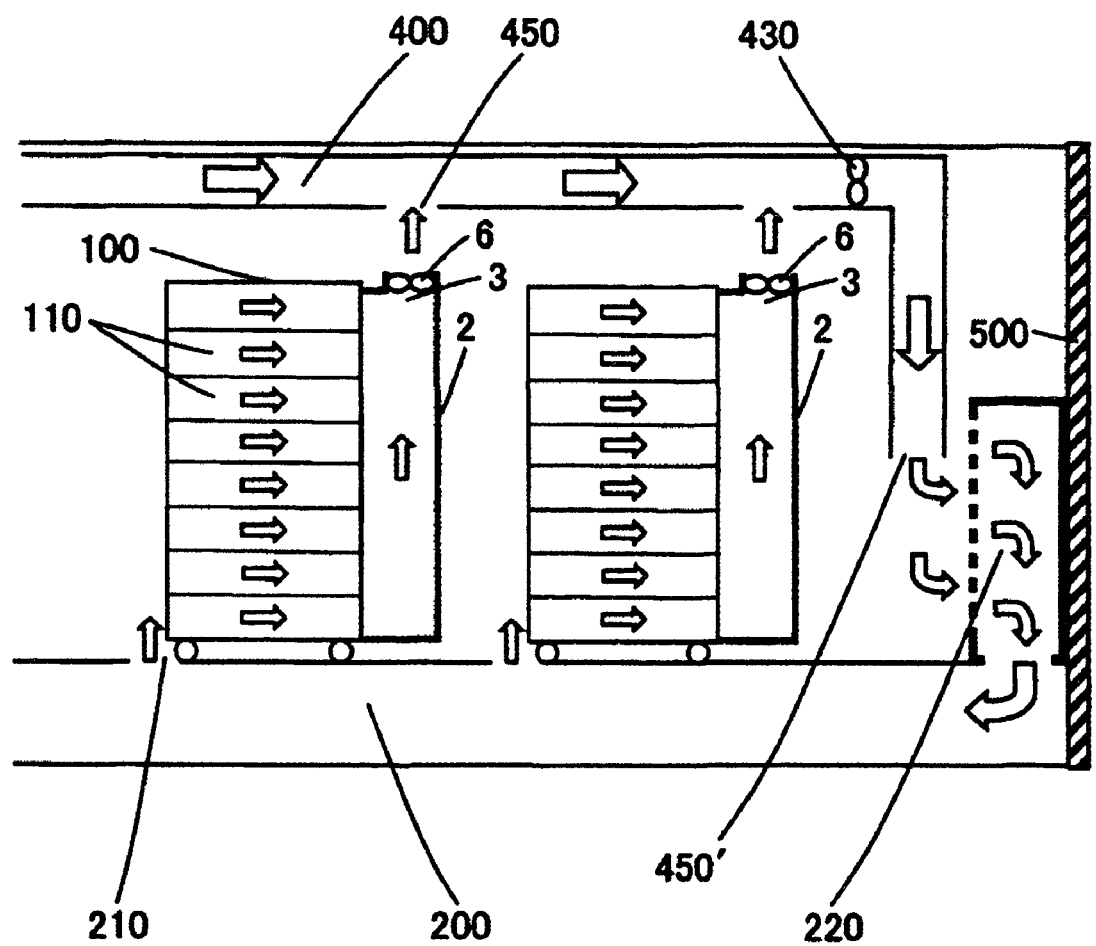
FIG. 9 is a schematic general view of a cooling system which is a seventh embodiment of the present invention.

A seventh embodiment of the present invention is shown in FIG. 9. FIG. 9 is a schematic general view of a cooling system in the present embodiment.

In the present embodiment, the cooling system is also configured by the electronics rack 100, the air conditioning area at below the floor level 200, the air conditioner 220, the ceiling air duct 400 and the like. In the present embodiment, the front cover 1 is also omitted.

In the present embodiment, an exhaust fan 6 is provided at an upper end portion of the exhaust air opening 3. Further, in the present embodiment, the duct opening 450 is provided at the position corresponding to the exhaust fan 6 in the ceiling air duct 400. The ceiling air duct 400 is provided with the duct fan 430, which causes indoor side air to flow. In the present embodiment, the heat exchanger 410 is omitted. Further, the duct opening 450' at the exhaust air side of the ceiling air duct 400 is provided just before the air conditioner 220.

The air warmed by cooling each of the electronics racks 100 is released in the jet flow state from the exhaust fan 6 provided at the upper end portion of each of the exhaust air openings 3 toward the duct opening 450 of the ceiling air duct 400. Thereafter, the air is collected in the ceiling air duct 400 by the operation of the duct fan 430 in the ceiling air duct 400, and thereafter, flows in the ceiling air duct 400 to be released into the chamber from the duct opening 450' in the immediate vicinity of the air conditioner 220.

In such a configuration, the indoor air which is warmed to about 50 to 60° C. by cooling the electronics rack 100 returns into the chamber from the duct opening 450', and thereafter, the air enters the air conditioner 220 without being mixed with the indoor air. Subsequently, the air is cooled to about 15 to 20° C. at which no condensation forms in the air conditioner 220. Thereafter, the air passes through the blowing in opening from below the floor level 210 from the air conditioning area at below the floor level 200, and flows into the electronics rack 100 again.

When a number of disk array apparatuses and electronic apparatuses are installed in the same space in the conventional data center or the like, if the apparatuses are mounted with high density, there arises the problem that the warmed air in the vicinity of the ceiling is easily taken in again. This causes increase in air conditioning cost and limitation of the number of apparatuses which are mounted. In the present embodiment, exhaust air flows smoothly to the ceiling side through the exhaust air opening 3, and returns to the indoor side just before the air conditioner 220. Therefore, the possibility of the electronics rack 100 taking in the warmed air in the vicinity of the ceiling again can be significantly decreased.

According to the present embodiment, the possibility of the electronics rack 100 taking in the warmed air in the vicinity of the ceiling again can be significantly decreased, and cooling efficiency can be enhanced. In the present embodiment, the exhaust air opening 3 does not need to be connected to the ceiling air duct 400, and therefore, the electronics rack 100 is easily installed.

In the present embodiment, the duct opening 450' at the exhaust air side of the ceiling air duct 400 is provided just before the air conditioner 220. By this, the warm air from each of the electronics racks 100 which is collected in the ceiling air duct 400 flows into the air conditioner 220 without mixing with the air in the chamber. Therefore, cooling efficiency in the air conditioner 220 is enhanced, and the effect of reducing the air conditioning load is provided.

Embodiment 8

Figure 10:
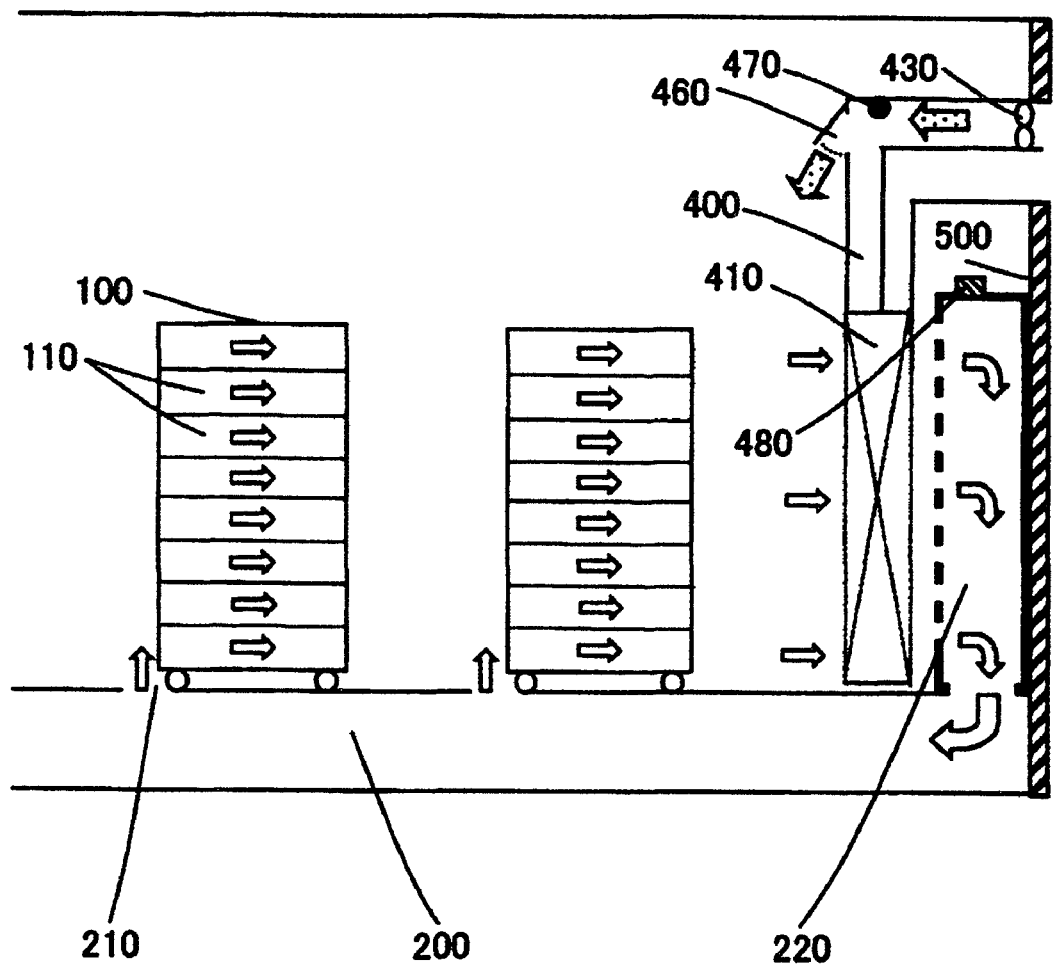
FIG. 10 is a schematic general view of a cooling system which is an eighth embodiment of the present invention.

FIG. 10 shows an eighth embodiment of the present invention. FIG. 10 is a schematic general view of a cooling system in the present embodiment.

In the present embodiment, the cooling system is also configured by the electronics rack 100, the air conditioning area at below the floor level 200, the air conditioner 220, the ceiling air duct 400 and the like. In the present embodiment, the front cover 1 and the back cover 2 are omitted.

In the present embodiment, the ceiling air duct 400 is constituted of one system in which external air flows, and the heat exchanger 410 is provided in the flow path. The heat exchanger 410 is for gas/gas, with one flow path being connected to the external air flowing inside the ceiling air duct 400, and with the other flow path being connected to the indoor air. The ceiling air duct 400 at the external air side is provided with the duct fan 430, and by the operation of the duct fan 430, external air flows inside the ceiling air duct 400. The air warmed by cooling each of the electronics racks 100 is released into the chamber from each of the exhaust air sides.

In the present embodiment, a controller 480 which interlocks with the air conditioner 220, a damper 460 and a temperature and humidity sensor 470 is provided. The damper 460 opens and closes depending on whether the value of the temperature and humidity sensor 470 is within the control reference of the indoor air or not.

In such a configuration, when the value of the temperature and humidity sensor 470 is outside the control reference of the indoor air, the damper 460 is brought into the closed state by the command from the controller 480. After the indoor air which is warmed by cooling the electronics rack 100 is released into the chamber, the air exchanges heat with external air in the heat exchanger 410 and cools, and thereafter, the air enters the air conditioner 220. The air is cooled to such a degree as not to form condensation in the air conditioner 220. Thereafter, the air passes through the blowing in opening from below the floor level 210 from the air conditioning area at below the floor level 200, and flows into the electronics rack 100 again. In this case, the external air and the indoor air are completely separated. Therefore, new humidity control as in the ordinary use of external air is not required, and energy required for humidification and de-humidification is not required, whereby energy is saved. Further, by heat exchange with external air, the temperature of air entering the air conditioner 220 lowers, and therefore, cooling load in the air conditioner 220 reduces, whereby energy is saved.

When the value of the temperature and humidity sensor 470 is within the control reference of the indoor air, the damper 460 is brought into the open state by the command from the controller 480, and the heat source portion other than the fan of the air conditioner 220 stops. Therefore, energy required for air-conditioning can be significantly reduced.

According to the present embodiment, cooling efficiency of the electronics rack 100 can be enhanced even with the relatively simple configuration.

In the present embodiment, the effect of being capable of simplifying the entire system configuration is provided. However, the electronics racks 100 in the second and following rows have the possibility of taking in the exhaust air coming out of the electronics racks 100 in the rows forward of them.

In short, in the case of the electronic apparatus of the present invention, the temperature variation between the electronic apparatuses installed in the data center is reduced, enhancement in reliability of the electronic apparatuses, and increase in life are achieved, and efficient cooling of the electronic apparatus group can be realized. Thereby, increase in the capacity and speed of the electronic apparatuses is realized. Further, electronic apparatus with low noise can be provided. In each of the embodiments of the present invention, the duct in which external air or the like flows is described as the ceiling air duct 400, but it goes without saying that the duct do not always have to be placed in the ceiling.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A cooling system comprising an inside room for containing therein an electronic device, an air conditioning area under its floor level, an air conditioner and a ceiling air duct,
    wherein the system further comprises a front cover arranged at a front side of the electronic device, a back cover arranged at a back side of the electronic device, an air supply opening arranged below the front cover, an air exhaust opening arranged above the back cover, a blowing opening connected to the air supply opening to supply the air from the air conditioning area into the inside room, and an air intake opening connected to the air exhaust opening to take the air from the inside room into the ceiling air duct; and
    wherein the ceiling air duct includes a flow path for the air discharged from the inside room, another flow path for the air to be taken from an outside of the system, and a heat exchanger for heat exchange between the air discharged from the inside room and the air taken from the outside of the system.

2. The cooling system according to claim 1, wherein the ceiling air duct includes another blowing opening to discharge the air from the ceiling air duct into the inside room, and a silencer arranged in the vicinity of the another blowing opening to be effective for the air discharged from the ceiling air duct into the inside room.

3. The cooling system according to claim 1, wherein the electronic device includes a plurality of memory and arithmetic elements, and the air exhaust opening includes a jet flow generator for discharging the air vertically upward.

4. The cooling system according to claim 3, wherein the jet flow generator includes a nozzle.

5. The cooling system according to claim 3, wherein the jet flow generator includes an exhaust fan.

6. The cooling system according to claim 3, wherein the apparatus cooling system further comprises a duct above the jet flow generator, and the duct has an opening at a position corresponding to the jet flow generator for each of the memory and arithmetic elements.

* * * * *